(12) United States Patent
Liu

(10) Patent No.: US 7,723,712 B2
(45) Date of Patent: May 25, 2010

(54) REDUCED POWER CONSUMPTION PHASE CHANGE MEMORY AND METHODS FOR FORMING THE SAME

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 11/377,664

(22) Filed: Mar. 17, 2006

(65) Prior Publication Data

US 2007/0221905 A1 Sep. 27, 2007

(51) Int. Cl.
*H01L 47/00* (2006.01)

(52) U.S. Cl. .................. 257/2; 257/E47.001; 438/102

(58) Field of Classification Search ........................ None
See application file for complete search history.

(56) References Cited

U.S. PATENT DOCUMENTS

| | | | |
|---|---|---|---|
| 6,087,674 A | 7/2000 | Ovshinsky et al. | |
| 6,856,002 B2 * | 2/2005 | Moore et al. | 257/529 |
| 6,867,996 B2 * | 3/2005 | Campbell et al. | 365/100 |
| 6,885,602 B2 | 4/2005 | Cho et al. | |
| 6,894,305 B2 | 5/2005 | Yi et al. | |
| 6,900,517 B2 | 5/2005 | Tanaka et al. | |
| 7,387,938 B2 * | 6/2008 | Hideki | 438/385 |
| 2001/0046765 A1 * | 11/2001 | Cappellani et al. | 438/627 |
| 2005/0002227 A1 * | 1/2005 | Hideki et al. | 365/163 |
| 2005/0029502 A1 * | 2/2005 | Hudgens | 257/4 |
| 2005/0051901 A1 | 3/2005 | Chen | |
| 2005/0254291 A1 | 11/2005 | Happ et al. | |
| 2006/0049390 A1 * | 3/2006 | Ufert et al. | 257/4 |

OTHER PUBLICATIONS

Kim, S.M. et al., "Electrical Properties and Crystal Structures of Nitrogen-doped Ge2Sb2Te5 Thin Film for Phase Change Memory", Thin Solid Films, Dec. 22, 2004, pp. 322-326, vol. 469-470, Elsevier-Sequoia S. A. Lausanne, CH.

Mtsuzaki, N. et al., "Oxygen-doped GeSbTe Phase-change Memory Cells Featuring 1.5-V/100-µA Standard 0.13-µm CMOS Operations", International Electron Devices Meeting 2005, pp. 1-4, IEEE, Piscataway, NJ, USA.

Dimitrov, D. et al., "The Influence of Oxygen and Nitrogen Doping on GeSbTe Phase-change Optical Recording Media Properties", Materials Science and Engineering, Mar. 15, 2004, pp. 107-112, vol. 107, No. 2, Elsevier Sequoia, Lausanne, CH.

Stefan Lai, et al., OUM-A 180 nm Nonvolatile Memory Cell Element Technology for Stand Alone and Embedded Applications, IEDM 2001, pp. 803-806.

Y,B, Gwabgm et al., Full Integration and Reliability Evaluation of Phase-change RAM Based on 0.24um-CMOS Technologies, 2003 Symposium on VLSI Technology, pp. 173-174.

(Continued)

*Primary Examiner*—Sue Purvis
*Assistant Examiner*—Benjamin P Sandvik
(74) *Attorney, Agent, or Firm*—Dickstein Shapiro LLP

(57) ABSTRACT

Memory cells for reduced power consumption and methods for forming the same are provided. A memory cell has a layer of phase change material. A first portion of the phase change material layer includes the programmable volume of the memory cell and its crystalline state has a higher resistivity than that of the crystalline state of a second portion of the phase change material layer.

40 Claims, 4 Drawing Sheets

OTHER PUBLICATIONS

H. Horri, et al., A Novel Cell Technology Using N-doped GeSbTe Films for Phase Change RAM, 2003 Symposium on SLSI Technology.

Y.N. Hwang, et al., Writing Current Reduction for High-density Phase-change RAM, 2003 IEEE, pp. 893-896.

S. Hudgens, et al., Overview of Phase-Change Chalcogenide Nonvolatile Memory Technology, MRS Bulletin, Nov. 2004, pp. 829-832.

Young-Tae Kim, et al., Programming Characteristics of Phase Change Random Access Memory Using Phase Change Simulations, Japanese Journal of Applied Physics, vol. 44, No. 4B, 2005, pp. 2701-2705.

* cited by examiner

REDUCED POWER CONSUMPTION PHASE CHANGE MEMORY AND METHODS FOR FORMING THE SAME

FIELD OF THE INVENTION

The present invention relates to semiconductor devices, and in particular phase change memory devices and methods of forming the same.

BACKGROUND OF THE INVENTION

Non-volatile memories are desirable for integrated circuits due to their ability to maintain data absent a power supply. Phase change materials have been investigated for use in non-volatile memory cells. Phase change memory cells include phase change materials, such as chalcogenide alloys, which are capable of stably transitioning at least partially between amorphous and crystalline phases. Each phase exhibits a particular resistance state and the resistance states distinguish at least two logic values of the memory cell. Specifically, an amorphous state exhibits a relatively high resistance, and a crystalline state exhibits a relatively low resistance.

As shown in FIG. 1, a typical phase change memory cell 10 has a layer 3 of phase change material between a first electrode 1, which is disposed within an insulating layer 5, and second electrode 2. As an example, the phase change material is a chalcogenide alloy, such as $Ge_2Sb_2Te_5$ or SbTeAg.

A portion of the phase change material 3, the programmable volume 4, is set to a particular resistance state according to the amount of current applied via the electrodes 1, 2 and the duration of that application. To obtain an amorphous state, a relatively high write current pulse (a reset pulse) is applied through the phase change cell 10 to melt a portion of the material for a short period of time. The current is removed and the cell 10 cools rapidly to a temperature below the crystallization temperature, which results in the portion 4 of the material 3 covering bottom electrode having an amorphous phase exhibiting a high resistance. To obtain a crystalline state, a lower current write pulse (a set pulse) is applied to the phase change cell 10 for a longer period of time to heat the material to a temperature above its crystallization point and below its melting point. This causes the amorphous portion of the material to re-crystallize to a crystalline phase that is maintained once the current is removed and the cell 10 is rapidly cooled.

A sought after characteristic of non-volatile memory is low power consumption. Often, however, phase change memory cells 10 require large operating currents. It is therefore desirable to provide a phase change memory cell with reduced current requirements.

One approach to reducing power consumption has been to modify the material of the phase change memory cell to achieve maximum power transfer. For example, in a GeSbTe-based phase change memory cell, one approach is to dope the entire GeSbTe-material with nitrogen, increasing its resistance. As described in more detail herein, applicant, however, has found that this approach has disadvantages.

A phase change memory cell having reduced power consumption and methods for forming the same would be desirable.

BRIEF SUMMARY OF THE INVENTION

Embodiments of the invention provide memory elements and methods for forming the same. According to one embodiment, a memory element has a layer of phase change material. A first portion of the phase change material layer includes the programmable volume of the memory cell. The crystalline phase of the first portion has a higher resistivity than the crystalline phase of a second portion of the phase change material layer.

The foregoing and other advantages and features of the invention will become more apparent from the detailed description of exemplary embodiments provided below with reference to the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any structure suitable for supporting an integrated circuit including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. As stated above, the substrate need not be semiconductor-based, but may be any support structure suitable for supporting an integrated circuit such as metals, alloys, glasses, polymers, ceramics, and any other supportive materials as is known in the art.

Figure 1:
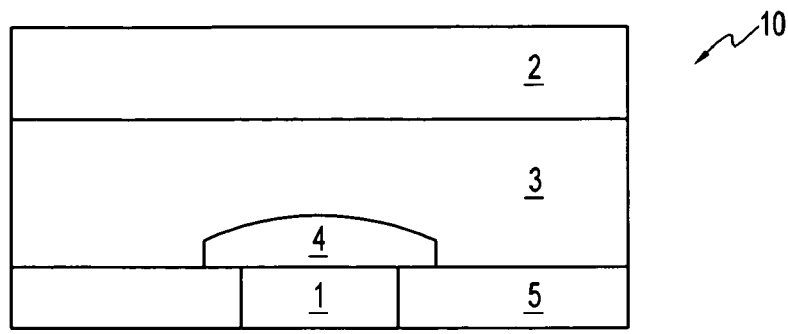
FIG. 1 depicts a conventional phase change memory cell.
Figure 2:
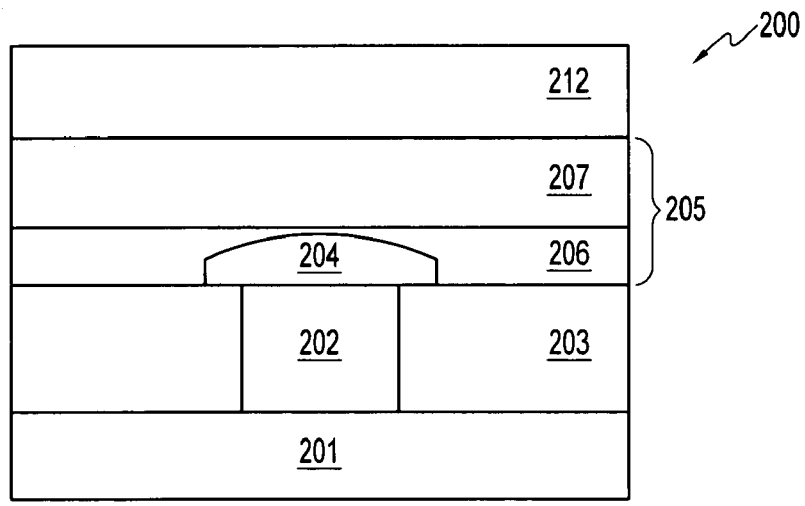
FIG. 2 depicts a phase change memory cell according to an exemplary embodiment of the invention.

The invention is now explained with reference to the figures, which illustrate exemplary embodiments and throughout which like reference numbers indicate like features. FIG. 2 depicts an exemplary embodiment of a phase change memory cell 200 constructed in accordance with the invention. The cell 200 shown in FIG. 2 is supported over a substrate 201. The substrate 201 can include additional structures (such as connections from the memory cell 200 to other circuitry) that are not shown.

A first electrode 202 passes through an opening in an insulating layer 203. Both the first electrode 202 and insulting layer 203 are provided over substrate 201. The first electrode 202 can be any suitable conductive material, such as titanium nitride (TiN), titanium aluminum nitride (TiAlN), titanium tungsten (TiW), platinum, tungsten, among others. The insulating layer 203 can be a nitride, such as silicon nitride ($Si_3N_4$), a low dielectric constant material, an insulating glass, or an insulating polymer; among other materials.

As shown in FIG. 2, a layer 205 of phase change material is over the first electrode 202 and the insulating layer 203. The phase change material is preferably a chalcogenide alloy, such as, for example, $Ge_xSb_yTe_z$ (e.g., $Ge_2Sb_2Te_5$), GaSb, $Ge_xTe_y$, SbTe (e.g., $Sb_2Te_3$), InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$ or GeSbSeTe. The phase change material layer 205 is electrically coupled to the first electrode 202 through the opening in the insulating layer 203.

Over the phase change material layer 205 is a second electrode 212. The second electrode 212 can be any suitable conductive material, for example, TiN, TiAlN, TiW, platinum, tungsten, among others.

The phase change material layer 205 includes a higher resistivity portion 206 and a lower resistivity portion 207. The relative resistivities are for a same phase, e.g., the crystalline phase, of the material layer 205. The higher resistivity portion 206 serves to maximize power transfer to enable reduced power consumption for the cell 200 as described in more detail below. The portion 207 serves to reduce the thermal sink effect of the second electrode 212 by providing a distance between the second electrode 212 and the programming volume 204.

In the illustrated embodiment, to achieve the different resistivities, the portion 206 is nitrogen doped $Ge_xSb_yTe_z$ and the portion 207 is $Ge_xSb_yTe_z$ that is substantially free of nitrogen. Alternatively, other suitable dopants can be used, such as, for example, oxygen. The higher resistivity portion 206 preferably includes the programmable volume 204 of the cell 200. As is known in the art, the programmable volume 204 is located at an interface with an electrode. In the exemplified embodiment, the programmable volume 204 is located at the interface of the first electrode 202 and the phase change material layer 205. Further, in the exemplified embodiment, the resistivity of portion 206 is increased by doping, e.g., nitrogen or oxygen doping.

Figure 3:
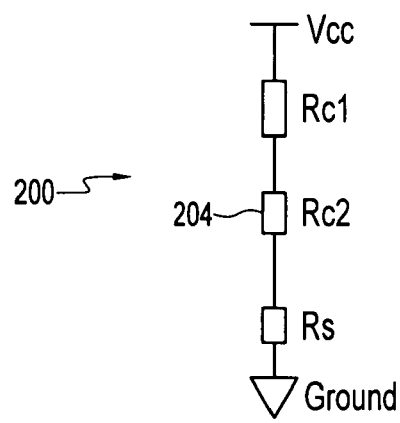
FIG. 3 is a schematic representation of the phase change memory cell of FIG. 3.

As schematically depicted in FIG. 3, the cell 200 includes a first resistivity portion having a resistance Rc1 corresponding to the programming volume 204 and a second resistivity portion having a resistance Rc2 corresponding to the portion 207. The cell 200 also includes the series resistance Rs of the underlying contacts (e.g., electrode 202 and other contacts (not shown)). Below is an explanation of how the total power consumption for the cell 200 is reduced by considering the power consumption for each part of the cell (Rc1, Rc2, Rs).

As is known, power consumption (P) is equal to the current (I) squared times the resistance (R) ($P=I^2 \times R$). By increasing the resistivity of the memory cell 200 portion 206 with respect to portion 207, the resistance Rc2 of the programming volume 204 is increased by a factor k. Therefore, to achieve the same power P for inducing the phase change in the programmable volume 204, the current used to program the cell 200 can be decreased by the square root of k. The reduced current results in decreased power consumption of the series resistance Rs by a factor of k. Also, since the resistance Rc2 of the portion 207 of the phase change material 205 is not increased, the power consumption of the portion 207 is also decreased by k times. Therefore, the overall power consumption of the cell 200 is reduced.

If the resistivity of the entirety of the phase change material layer 205 were increased, the resistivity of the portion 207 would also increase by a factor of k, thereby increasing its power consumption. Accordingly, Applicant has discovered that by providing a memory element 205 having portions of different resistivities, power consumption of the memory cell 200 can be reduced.

Figure 4A:
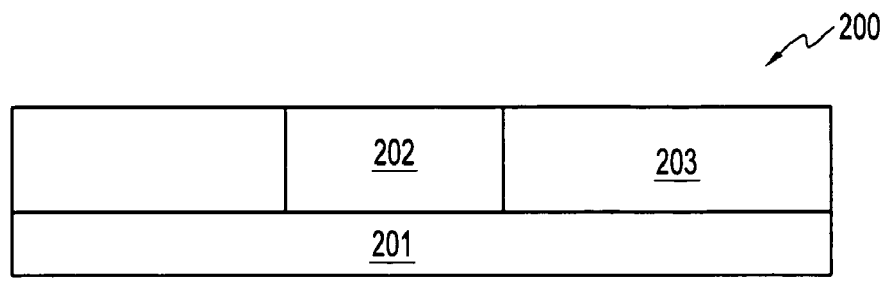
FIGS. 4A-4C depict the formation of the memory cell of FIG. 2 at different stages of processing.
Figure 4B:
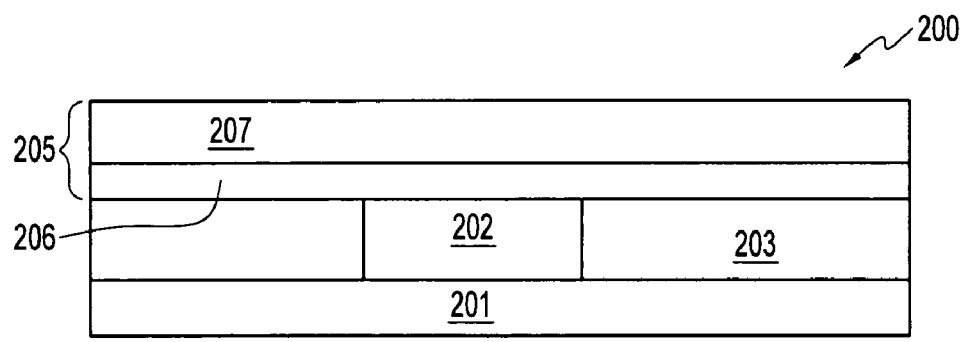
Figure 4C:
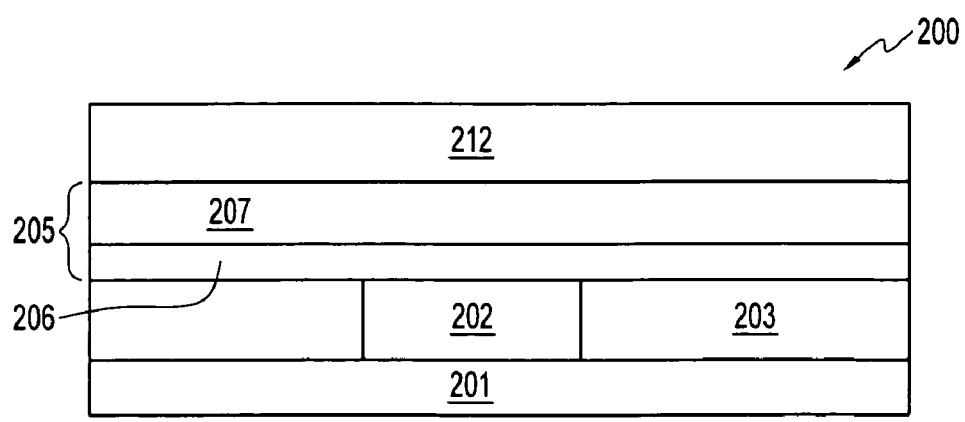

FIGS. 4A-4C are cross sectional views of a wafer fragment depicting the formation of the memory cell 200 according to an exemplary embodiment of the invention. No particular order is required for any of the actions described herein, except for those logically requiring the results of prior actions. Accordingly, while the actions below are described as being performed in a specific order, the order is exemplary only and can be altered if desired. Although the formation of a single memory cell 200 is shown, it should be appreciated that the memory cell 200 can be one in an array of memory cells, which can be formed concurrently.

As shown by FIG. 4A, a substrate 201 is initially provided. As indicated above, the substrate 201 can be semiconductor-based or another material useful as an integrated circuit supporting structure as is known in the art. A first electrode 202 and an insulating layer 203 are formed over the substrate 201. The first electrode 202 can be formed within an opening in the second insulating layer 203 such that the surface of the first electrode 202 is exposed. The insulating layer 203 can be a nitride, such as silicon nitride ($Si_3N_4$), a low dielectric constant material, an insulating glass, or an insulating polymer; among other materials, and may be formed by any method known in the art.

As shown in FIG. 4B, a layer 205 of phase change material, e.g., $Ge_xSb_yTe_z$ (e.g., $Ge_2Sb_2Te_5$), is formed over the first electrode 202 and insulating layer 203. Formation of the layer 205 may be accomplished by any suitable method. In one embodiment, during deposition of the first portion 206 of the phase change material layer 205, a flow of dopant gas, for example, nitrogen or oxygen gas, is provided to dope the portion 206. Alternatively, the doping of portion 206 can be conducted after the formation of the layer 205 by conducting an implantation step to implant, for example nitrogen or oxygen. Portion 207 of the layer 205 is not doped.

As illustrated in FIG. 4C, a conductive material is deposited over the phase change layer 205 to form a second electrode 212. Similar to the first electrode 202, the conductive material for the second electrode 212 may be any material suitable for a conductive electrode, for example, TiN, TiAlN, TiW, platinum, tungsten, among others. In the illustrated embodiment, the layers 205 and 212 are formed as blanket layers. It is understood layers 205 and 212 can be subsequently patterned as desired by, for example, and insitu or exsitu etch method.

Additional processing steps can be performed, for example, to form connections to other circuitry of the integrated circuit (e.g., logic circuitry, sense amplifiers, etc.) of which the memory cell 200 is a part, as is known in the art.

Figure 5:
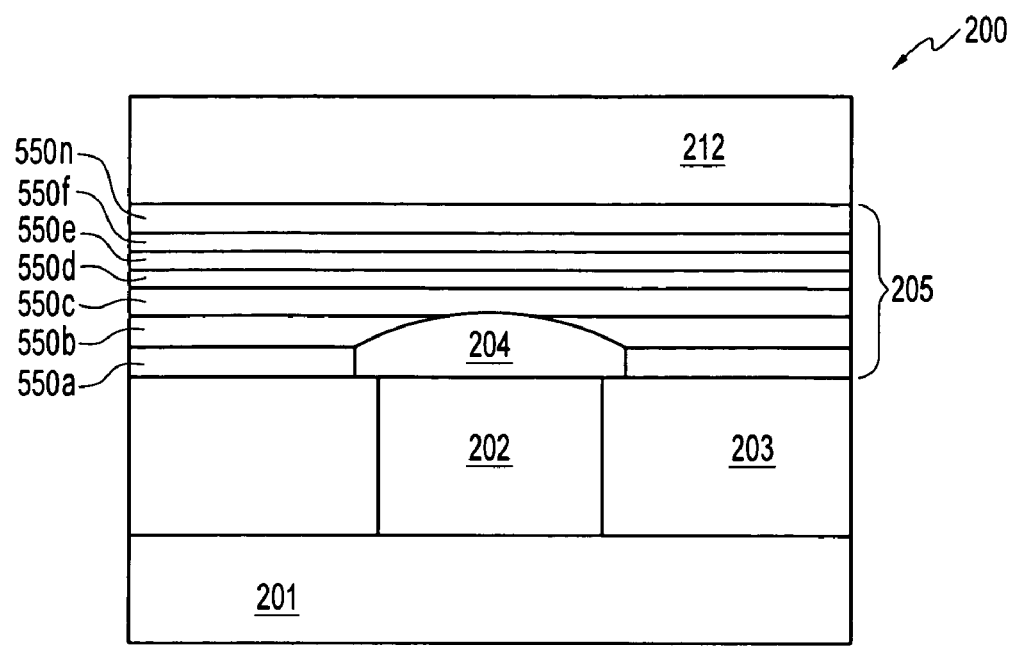
FIG. 5 depicts a phase change memory cell according to another exemplary embodiment of the invention.
Figure 6:
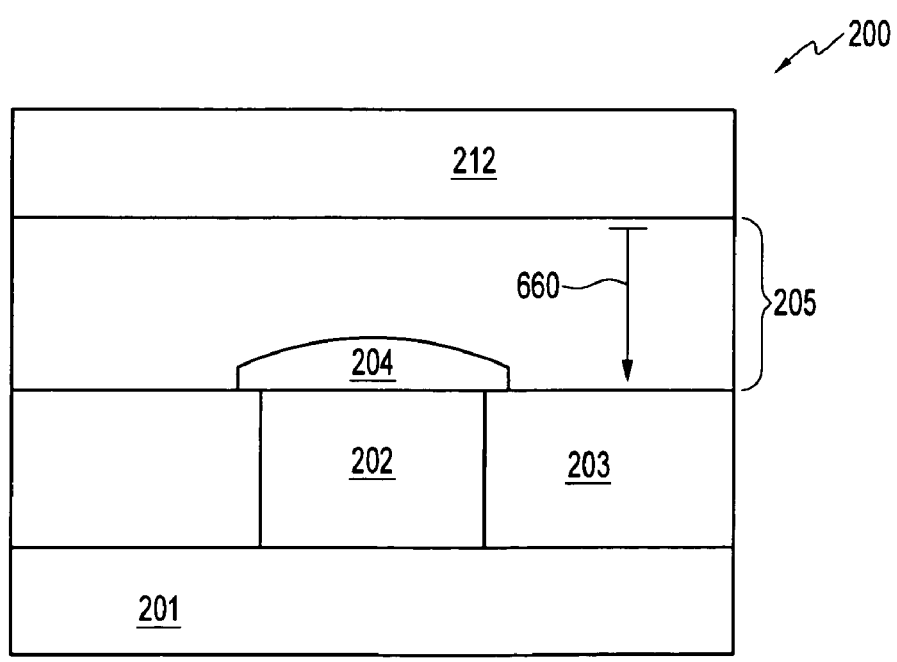
FIG. 6 depicts a phase change memory cell according to another exemplary embodiment of the invention.

FIGS. 5 and 6 depict alternative embodiments of the memory cell 200. In the exemplary embodiment depicted in FIG. 5, the phase change layer 205 includes a plurality of layers 550a-550n of phase change material. The crystalline phases of the layers 550a-550n have different resistivities and, in the illustrated embodiment, the resistivities of the layers increases with increasing proximity to the first electrode 202. For example, the crystalline phase of layer 550a has a greater resistivity than a crystalline phase of layer 550b; and the crystalline phase of layer 550b has a greater resistivity than a crystalline phase of layer 550c; and so forth.

The layers 550a-550n can be same or different phase change materials. Each layer 550a-550n can be doped with varying concentrations of a dopant or can remain undoped to determine the resistivity of the crystalline phase of the respective layer 550a-550n. The individual layers 550a-550n can be formed similarly to layers 206 and 207 as described above in connection with FIG. 4B. Although layers 550a-550n are shown, the phase change layer 205 can include any number of individual layers.

In the exemplary embodiment of FIG. 6, the phase change layer 205 is gradient doped with a dopant, e.g., nitrogen or oxygen. As shown in FIG. 6, the dopant gradient 660 is formed such that the resistivity of the crystalline phase of the phase change layer 205 increases in a gradient manner from the second electrode 212 to the first electrode 202. The gradient 660 can be, for example, a linear or exponential gradient. If desired, the portion of the phase change layer 205 adjacent the second electrode 212 can be substantially free of the dopant. Also, the resistivity gradient 660 can be achieved using different dopants for different portions of the gradient 660.

The gradient 660 can be formed similarly to layers 206 and 207 as described above in connection with FIG. 4B. For example, to form the gradient 660 during the formation of phase change layer 205, the flow of dopant gas can be adjusted to achieve the desired gradient 660.

Figure 7:
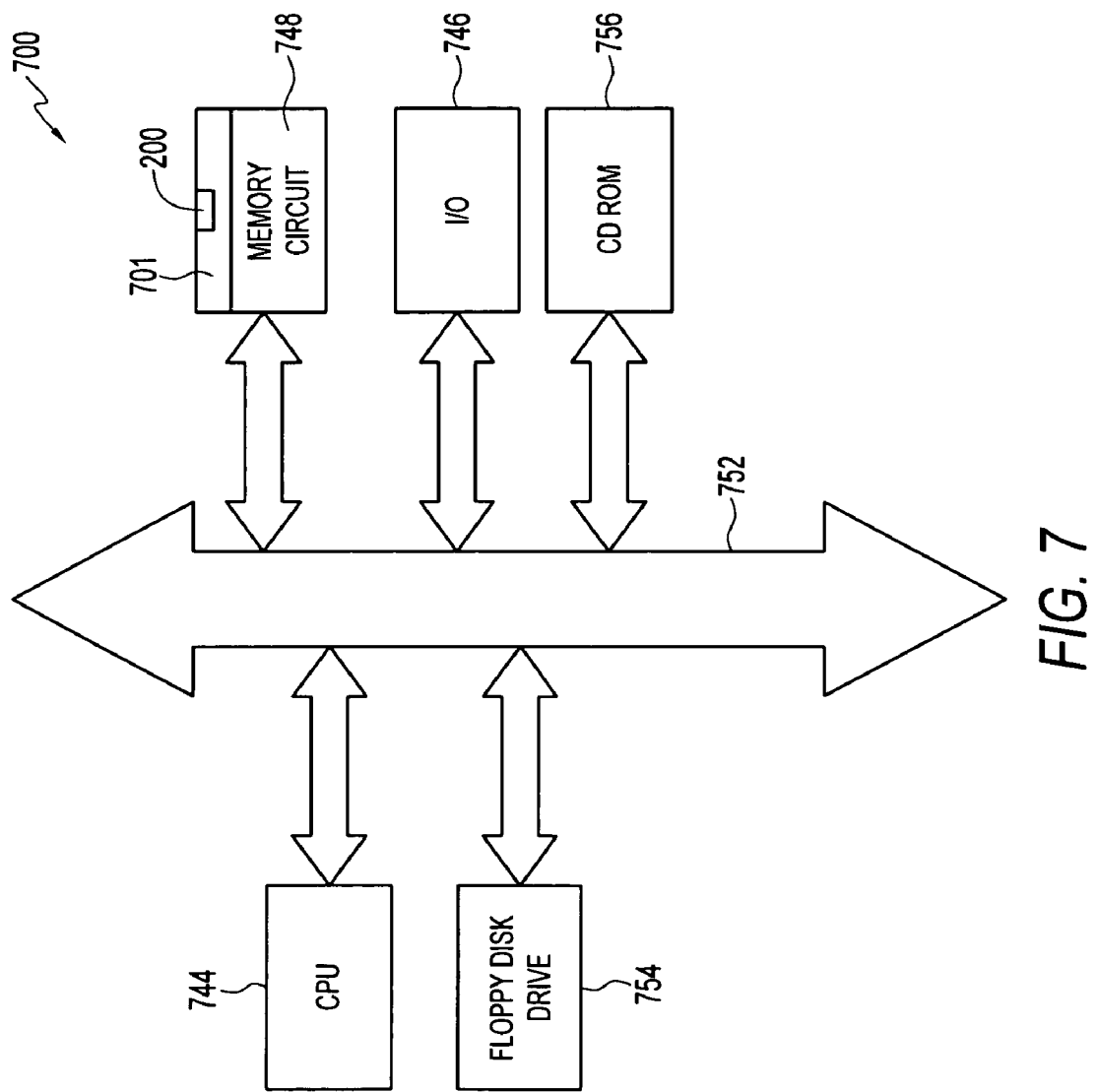
FIG. 7 is a block diagram of a system including a memory cell according to an exemplary embodiment of the invention.

FIG. 7 illustrates a processor system 700 which includes a memory circuit 748, e.g., a memory device, which employs memory array 701, which includes memory cells 200 constructed according to the invention. The processor system 700, which can be, for example, a computer system, generally comprises a central processing unit (CPU) 744, such as a microprocessor, a digital signal processor, or other programmable digital logic devices, which communicates with an input/output (I/O) device 746 over a bus 752. The memory circuit 748 communicates with the CPU 744 over bus 752 typically through a memory controller.

In the case of a computer system, the processor system 700 may include peripheral devices such as a floppy disk drive or hard drive 754 and a compact disc (CD) ROM drive 756, which also communicate with CPU 744 over the bus 752. Memory circuit 748 is preferably constructed as an integrated circuit, which includes a memory array 701 having at least one memory cell 200 according to the invention. If desired, the memory circuit 748 may be combined with the processor, for example CPU 744, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory element comprising:
   a region of crystalline phase change material comprising first and second portions of phase change material in series with one another, at least a segment of the region of phase change material configured to switch between an amorphous phase and a crystalline phase during operation of the memory element, a crystalline phase of the first portion having a higher resistivity than a resistivity of the crystalline phase of the second portion, wherein the first portion is in contact with a first electrode, and the second portion is in contact with the first portion.

2. The memory element of claim 1, wherein the phase change material comprises a material selected from the group consisting of $Ge_xSb_yTe_z$, GaSb, $Ge_xTe_y$, SbTe, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$ and GeSbSeTe.

3. The memory element of claim 1, wherein the first portion is doped to have the higher resistivity.

4. The memory element of claim 3, wherein the first portion is doped with nitrogen.

5. The memory element of claim 3, wherein the first portion is doped with oxygen.

6. The memory element of claim 1, wherein the first portion comprises the segment of the region of phase change material.

7. The memory element of claim 1, wherein at least the first portion is gradient doped.

8. The memory element of claim 1, wherein the region of phase change material comprises a plurality of layers of phase change material.

9. The memory element of claim 1, wherein the region of phase change material further comprises at least a third portion in series with the first and second portions, a crystalline phase of the third portion having a different resistivity than the resistivities of the crystalline phase of the first and second portions.

10. The memory element of claim 1, wherein the first and second portions comprise a resistivity gradient.

11. A memory array comprising:
   a plurality of memory cells, at least one memory cell comprising:
   a first electrode;
   a second electrode; and
   a region of crystalline phase change material between the first and second electrodes, the phase change material region comprising first and second portions of phase change material, the first portion comprising a programmable volume configured to switch between an amorphous phase and a crystalline phase during operation of the at least one memory cell, a crystalline phase of the first portion having a higher resistivity than a resistivity of the crystalline phase of the second portion, and wherein the first portion is in contact with the first electrode, and the second portion is in contact with the first portion.

12. The memory array of claim 11, wherein the phase change material comprises a material selected from the group consisting of $Ge_xSb_yTe_z$, GaSb, $Ge_xTe_y$, SbTe, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$ and GeSbSeTe.

13. The memory array of claim 11, wherein the first portion is doped to have the higher resistivity.

14. The memory array of claim 13, wherein the first portion is doped with nitrogen.

15. The memory array of claim 13, wherein the first portion is doped with oxygen.

16. The memory array of claim 11, wherein at least the first portion is gradient doped.

17. The memory array of claim 11, wherein the region of phase change material comprises a plurality of layers of phase change material.

18. The memory array of claim 11, wherein the region of phase change material further comprises at least a third portion in series with the first and second portions, a crystalline phase of the third portion having a different resistivity than the resistivities of the crystalline phase of the first and second portions.

19. The memory array of claim 11, wherein the first and second portions comprise a resistivity gradient.

20. A processor system comprising:
a processor; and
a memory device comprising a memory cell, the memory cell comprising:
a first electrode,
a second electrode,
a crystalline phase change material between the first and second electrodes, at least a segment of the phase change material configured to switch between an amorphous phase and a crystalline phase during operation of the memory cell, the phase change material having first and second portions of phase change material, the first portion comprising at least one of a nitrogen and oxygen dopant, a crystalline phase of the first portion having a higher resistivity than a resistivity of the crystalline phase of the second portion, and wherein the first portion is in contact with the first electrode, and the second portion is in contact with the first portion.

21. The system of claim 20, wherein the first portion comprises a the segment of the phase change material.

22. The system of claim 20, wherein the first portion is at an interface of the first electrode and the phase change material.

23. The system of claim 20, wherein at least the first portion is gradient doped.

24. The system of claim 20, wherein the phase change material further comprises at least a third portion in series with the first and second portions, a crystalline phase of the third portion having a different resistivity than the resistivities of the crystalline phase of the first and second portions.

25. A method of forming a memory cell, comprising:
forming a first electrode;
forming a second electrode;
forming a crystalline region of phase change material between the first and second electrodes, at least a segment of the region of phase change material configured to switch between an amorphous phase and a crystalline phase during operation of the memory cell, the phase change material region formed such that a first portion of phase change material is in contact with the first electrode, a second portion of phase change material is in contact with the first portion, and a resistivity of a crystalline phase of the first portion of the phase change material region is greater than a resistivity of a crystalline phase of the second portion of the phase change material region, the first portion comprising a programmable volume.

26. The method of claim 25, wherein the phase change material region comprises a material selected from the group consisting of $Ge_xSb_yTe_z$, GaSb, $Ge_xTe_y$, SbTe, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$ and GeSbSeTe.

27. The method of claim 25, further comprising doping the first portion.

28. The method of claim 27, wherein the dopant is nitrogen.

29. The method of claim 27, wherein the dopant is oxygen.

30. The method of claim 27, wherein doping the first portion comprises providing a dopant gas flow during the act of forming the phase change material region.

31. The method of claim 27, wherein doping the first portion comprises implanting the dopant after the act of forming the phase change material region.

32. The method of claim 25, wherein at least one of the first and second electrodes are formed comprising at leas t one of TiN, TiAlN, TiW and tungsten.

33. The method of claim 27, wherein doping the first portion comprises gradient doping at least the first portion.

34. The method of claim 25, wherein forming the phase change material region comprises forming a plurality of layers of phase change material.

35. The method of claim 25, wherein the region of phase change material is formed further comprising at least a third portion in series with the first and second portions, a crystalline phase of the third portion having a different resistivity than the resistivities of the crystalline phase of the first and second portions.

36. The method of claim 25, wherein forming the region of phase change material comprises forming the region of phase change material having a resistivity gradient.

37. A method of forming a memory cell, the method comprising the acts of:
forming a first electrode;
forming a second electrode;
forming a crystalline phase change material region comprising a first portion of phase change material and a second portion of phase change material, the phase change material region configured to switch between an amorphous phase and a crystalline phase during operation of the memory cell, wherein the first portion is over and in contact with the first electrode, and the second portion is in contact with the first portion; and
doping the first portion of the phase change material region with at least one of nitrogen and oxygen such that a crystalline phase of the first portion has a higher resistivity than a resistivity of the crystalline phase of the second portion.

38. The method of claim 37, wherein doping the first portion comprises doping a programmable volume.

39. The system of claim 37, wherein doping the first portion comprises doping an interface of the first electrode and the phase change material region.

40. The method of claim 37, wherein doping the first portion comprises gradient doping at least the first portion.

* * * * *

UNITED STATES PATENT AND TRADEMARK OFFICE
CERTIFICATE OF CORRECTION

| | |
|---|---|
| PATENT NO. | : 7,723,712 B2 |
| APPLICATION NO. | : 11/377664 |
| DATED | : May 25, 2010 |
| INVENTOR(S) | : Jun Liu |

It is certified that error appears in the above-identified patent and that said Letters Patent is hereby corrected as shown below:

In column 7, line 20, in Claim 21, delete "a the" and insert -- the --, therefore.

In column 8, line 11, in Claim 32, delete "leas t" and insert -- least --, therefore.

Signed and Sealed this

Third Day of August, 2010

David J. Kappos
*Director of the United States Patent and Trademark Office*